United States Patent [19]

Lee

[11] Patent Number: 5,600,586

[45] Date of Patent: Feb. 4, 1997

[54] FLAT-CELL ROM AND DECODER

[75] Inventor: Peter W. Lee, Saratoga, Calif.

[73] Assignee: Aplus Integrated Circuits, Inc., Saratoga, Calif.

[21] Appl. No.: 279,682

[22] Filed: Jul. 25, 1994

Related U.S. Application Data

[63] Continuation-in-part of Ser. No. 249,801, May 26, 1994, abandoned.

[51] Int. Cl.⁶ .................................................. G11C 17/00
[52] U.S. Cl. .............................................. 365/104; 365/63
[58] Field of Search ................................... 365/103, 104, 365/230.04, 51, 63; 257/758

[56] References Cited

U.S. PATENT DOCUMENTS

| | | | |
|---|---|---|---|
| 5,111,428 | 5/1992 | Liang et al. | 365/104 |
| 5,117,389 | 5/1992 | Yiu | 365/104 |
| 5,280,442 | 1/1994 | Hotta | 365/63 |
| 5,295,092 | 3/1994 | Hotta | 365/104 |
| 5,386,381 | 1/1995 | Takizawa | 365/104 |
| 5,418,175 | 5/1995 | Hsue | 437/48 |
| 5,453,392 | 9/1995 | Hong | 437/49 |

OTHER PUBLICATIONS

"Semiconductor Memory Device and Process for Producing Same"; Sharp Kabushiki Kaisha; European patent application 88306931.2; Filed Jul. 27, 1988; Publication #0 302 659, Feb. 2, 1989.

"16Mb ROM Design Using Bank Select Architecture"; Mikiro Okada et al.; Sharp Corporation; 1988 VLSI Circuits Symposium (Tokyo), Digest of Technical Papers; Aug. 22–24, 1988; pp. 85–86.

*Primary Examiner*—A. Zarabian
*Attorney, Agent, or Firm*—Flehr, Hohbach, Test, Albritton & Herbert

[57] ABSTRACT

A flat-cell ROM array includes a bank of field effect transistors, each having a source, drain and gate, formed by ion implantation between columns of buried N+ and under rows of polysilicon, wherein adjacent columns of buried N+ are the source and drain of at least one transistor and a corresponding row of polysilicon is the gate of the transistor. Each of these transistors is programmed to have one of a plurality of threshold voltages depending on a desired storage value. Attached to the bank of transistors is an upper selector network associated with the bank connected to a first class of alternating sets of the columns, and a lower selector network associated with the bank connected to a second class of alternating sets of the columns. A method provides steps for performing the present invention.

15 Claims, 12 Drawing Sheets

FLAT-CELL ROM AND DECODER

DISCLOSE

This is a continuation-in-part of application Ser. No. 08/249,801 filed May 26, 1994 now abandoned.

BACKGROUND OF THE INVENTION

The present invention relates to a flat-cell ROM and decoder.

A flat-cell read-only memory (ROM) is formed on a substrate by implanting columns of buried N+ and depositing rows of polysilicon. Transistor channel regions are created between the buried N+ columns and under the polysilicon rows and are arranged in columns and rows corresponding to the buried N+ columns and polysilicon rows. The transistors each have a source, drain and gate, where the source and drain are represented by adjacent buried N+ columns and the gate is represented by the polysilicon row. Each transistor represents a ROM storage location.

The ROM storage value of each location depends on the amount of ion implantation (doping) that the channel receives. To program the ROM, all channel locations receive a blanket doping to develop transistors having a voltage threshold (Vt1) of approximately 0.7 V. Then, desired locations are programmed off by an additional ion implant, or target-doping, to develop transistors having a voltage threshold (Vt2) of approximately 6 V. As a result, the blanket-doped locations have a first value associated therewith and the target-doped locations have a second value associated therewith. Often these values are considered as binary values of "0" and "1."

If the channel is blanket-doped, it is considered a valid transistor and current flow from the source to drain begins once the threshold Vt1 is met at the gate. The arrangement where a column of storage locations share a common buried N+ source line and a common N+ drain line results in what is commonly referred to as a NOR array. That is, the addressed storage value is determined using what is known in the art as a Not-OR (NOR) table.

In a common NOR array, the buried N+ columns are considered bitlines and the polysilicon rows are considered wordlines. An address identified memory location is determined by decoding the bitlines and wordlines to activate the source, drain and gate of the memory location. For example, at a normal operating voltage where Vcc is 5 V, if the channel is blanket-doped, it conducts at a threshold of 0.7 V and a "0" is associated with the location, and if the channel is target-doped, it does not conduct and a "1" is associated with the location.

In practice, a flat-cell ROM is beneficial for high density memory storage. However, since the flat-cell concept requires columns of slow-conductivity buried N+, design limits are placed on the size of a flat-cell array. These design limits are primarily a matter of ROM access time; that is, a large array is dense but slow. To accommodate this design limit, banks of flat-cell arrays are connected to one another via metal bitlines, where a typical bank has 16 or 32 rows.

Another design difficulty involves selecting the memory locations. Several techniques have been introduced to overcome this hurdle. One technique involves pairing the columns and providing a selecting circuit to select one of the columns for output, however, this technique requires dedicated power lines and tight design tolerances due to close contact pitch. Another technique uses a zig-zag metal bitline layout but still requires tight design tolerances.

What is needed is a flat-cell ROM that has the benefits of high density and an efficient decoding and selection scheme, can selectively couple power and sense amplification to any column, and has a metal bitline pitch that permits easy manufacture and relaxed design tolerances.

SUMMARY OF THE INVENTION

The present invention provides a superior flat-cell read-only memory (ROM) and decoder.

A flat-cell ROM array is formed on a substrate by implanting columns of buried N+ and depositing rows of polysilicon. Transistor channel regions are created between the buried N+ columns and under the polysilicon rows and are arranged in columns and rows corresponding to the buried N+ columns and polysilicon rows. The transistors each have a source, drain and gate, where the source and drain are represented by adjacent buried N+ columns and the gate is represented by the polysilicon row. Each transistor represents a ROM storage location and each of these locations is programmed to have one of a plurality of threshold voltages depending on a desired storage value.

These buried N+ columns and polysilicon rows are designed as a bank to promote timely access to the memory locations. Attached to each bank is an upper selector network connected to a first class of alternating sets of the columns, and a lower selector network connected to a second class of alternating sets of the columns. This design results in a high density flat-cell ROM with an efficient decoding and selection scheme. This design also provides a metal bitline spacing and active contact spacing that promotes easy manufacture and relaxed design tolerances.

An associated decoder network decodes an address and activates specific columns and rows of the array to determine the ROM storage value of the identified location. This decoder network, along with the upper and lower selectors can selectively couple power and sense amplification to any column.

A method provides steps for performing the present invention.

Other features and advantages of the invention will be described or will become apparent with reference to the following figures and detailed description of the preferred embodiments.

DETAILED DESCRIPTION OF THE PREFERRED EMBODIMENTS

The following description is provided in accordance with the patent statutes. Those skilled in the art will appreciate that various changes and modifications can be made to the preferred embodiment while remaining within the scope of the appended claims.

In this specification, the term blanket-doped refers to channels having a blanket implant, e.g., a light boron implant, with a light ion concentration. The term target-doped refers to channels having an additional implant, e.g. a heavy boron implant, greater than that of the blanket-doped channels.

Figure 1:
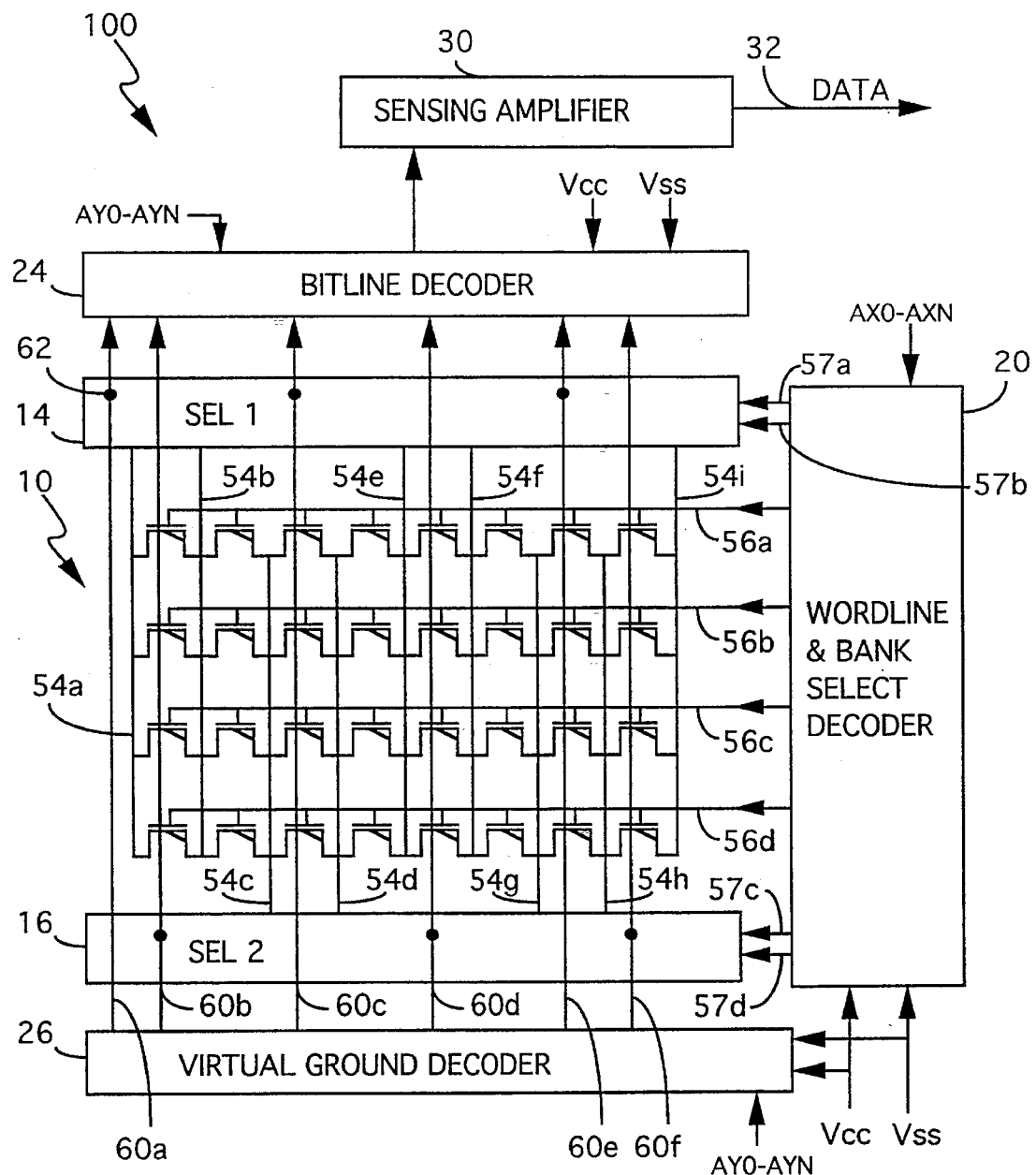
FIG. 1 depicts a ROM having a single-bank flat-cell array incorporating the invention.
Figure 2:
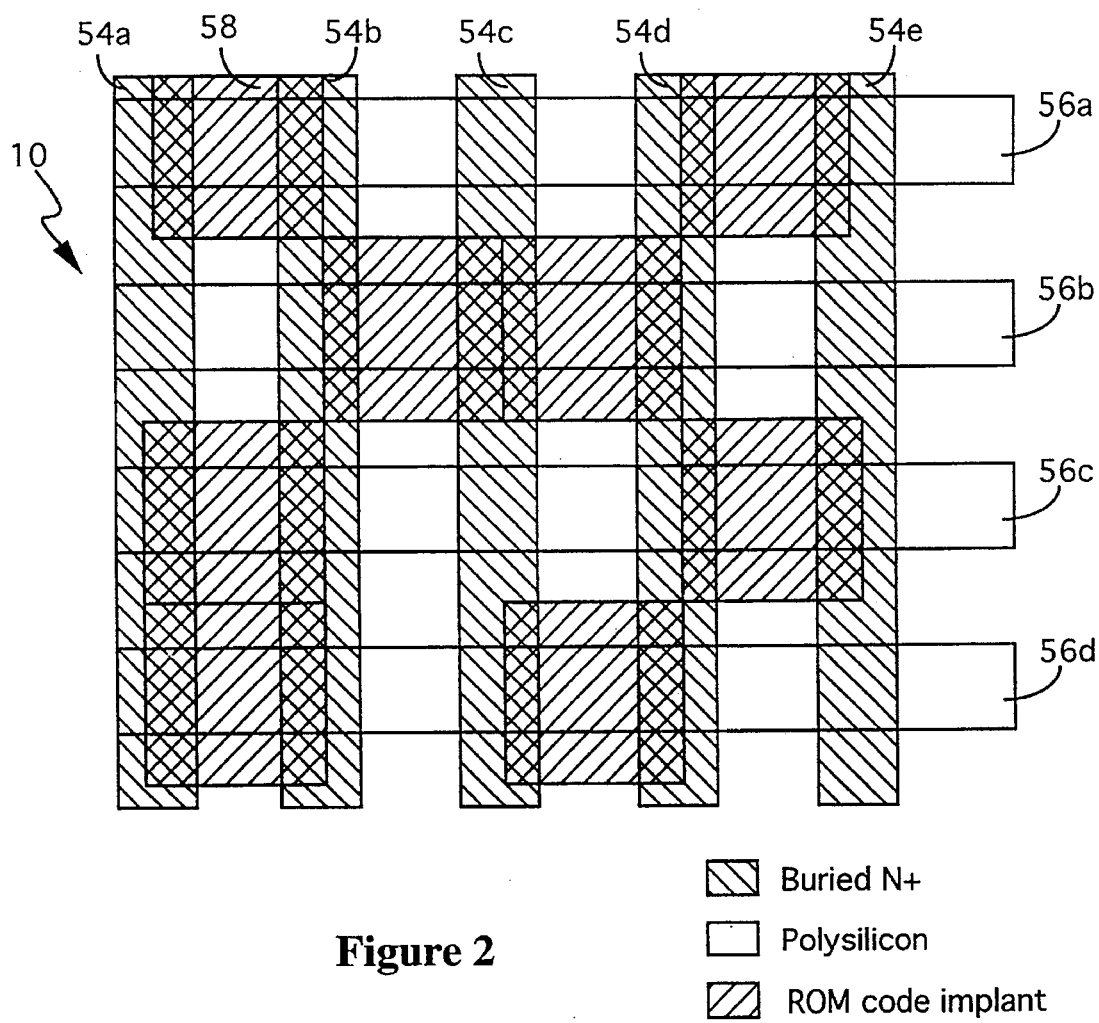
FIG. 2 depicts an enlarged view of the columns and rows of a flat-cell bank.
Figure 3:
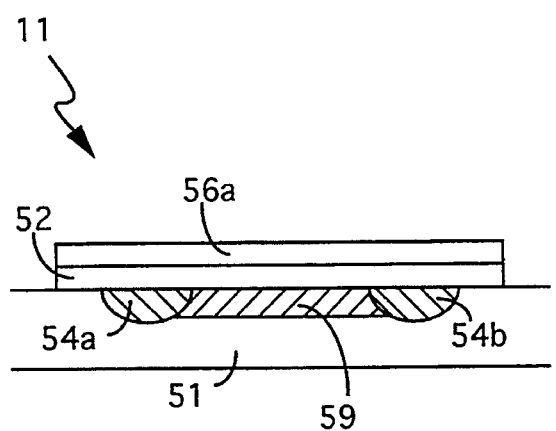
FIG. 3 depicts a transistor of the flat-cell bank.

FIGS. 1–3 depict a ROM 100 having a single-bank flat-cell array 10 incorporating the invention. Single-bank flat-cell arrays are beneficial for slow speed applications. The flat-cell array 10 is formed on a substrate by implanting columns 54a–i of conductive buried N+ and rows 56a–d of conductive polysilicon. Transistor channel regions are created between the buried N+ columns 54a–i and under the polysilicon rows 56a–d, and are arranged in columns and rows corresponding to the buried N+ columns and polysilicon rows. The transistors each have a source, drain and gate, where the source and drain are represented by adjacent buried N+ columns and the gate is represented by the polysilicon row. Each transistor represents a ROM storage location.

The ROM storage value of each location depends on the amount of doping the channel receives. To program the ROM 100, all channels receive a blanket doping to develop transistors having a first threshold, Vt1. Then, desired locations are programmed off by additional doping, target-doping, resulting in transistors having a second threshold, Vt2. The blanket-doped locations are considered valid transistors and represent a first storage value. The target-doped locations are considered void transistors and represent a second storage value. Often these storage values are considered as binary values of "0" and "1."

The array 10 represents the storage for the ROM 100. As such, the columns 54a–i are referred to as bitlines and the rows 54a–d are referred to a wordlines. This arrangement of array 10, where a column of storage locations share a common buried N+ source line and a common N+ drain line results in what is referred to as a NOR array. In a NOR array, an address identified memory location is determined by decoding the wordline and bitline to activate the source, drain and gate of the memory location. A voltage pull-up to Vbias is connected to the metal bitlines 60a–e. For example, a pull-up transistor is placed between Vcc and active contact locations 62 to establish the metal bitlines at a Vbias of 1.5 V. According to the address AY0-AYN, the virtual ground decoder 26 couples a defined bitline 60a–f to Vss, which in turn couples a defined source column 54a–i to Vss. If any of the transistors turns on, the drain column is pulled near Vss and the value of the location is ascertained to be low. If no transistor turn on, the drain line remains at Vbias and the value of the location is ascertained to be high. For example, at a normal operating voltage where Vcc is 5 V, Vss is 0 v, and Vbias is 1.5 V, if the channel is blanket-doped it conducts at a threshold of 0.7 V and a "0" is associated with the location, and if the channel is target-doped it does not conduct and a "1" is associated with the location.

To effect a NOR flat-cell array and decoding scheme, the array 10 is connected above to selector 14 and below to selector 16. These selectors are selectively coupled to buried N+ columns 54a–i to provide access to each of the metal bitline columns 60a–f for the bitline decoder 24 and virtual ground decoder 26 through connections to bitlines 60a–f at contacts 62. Note that the class of pairs of columns 54a–b, 54e–f and 54i connect to upper selector 14, while the class of pairs of columns 54c–d and 54g–h connect to lower selector 16. In this specification, an upper selector and a lower selector are described with reference to an array 10 since the selectors control access to the array and are positioned on either side of an array 10; these terms do not place any geometrical limitation on the selector locations. Also note that active contacts 62 are made in the selectors 14 and 16 at every other bitline trace. This connection scheme facilitates the unique coupling between bitlines 60a–f and columns 54a–i, as discussed below with respect to FIGS. 5–9.

A wordline and bank select decoder 20 is connected to the rows 56a–d of the array 10, and to the selector 14 and selector 16 via lines 57a–b and 57c–d. The wordline and bank select decoder 20 receives an address AX0-AXN and decode it to choose a given row 56a–d and selector or selectors 14, 16. The wordline decoder 20 couples power to a selected row 56a–d that represents gates of the transistors in the word line. Any valid transistor in the selected row 56a–d is turned on by the application of power to the selected wordline, and it conducts current from one buried N+ bitline 54a–i to an adjacent one when there is a bias across them.

The wordline decoder 20 also controls the selectors 14, 16 via lines 57a–b and 57c–d. Coordination of the selectors is done to couple the source of a selected location (transistor) to the virtual ground decoder 26 and the drain to the bitline decoder 24. These connections can be made in any of several ways.

To discuss an example, the wordline and bank select decoder decodes an address AX0-AXN and instructs selector 14 to couple the column 54b, representing the drains of the second column of transistors, to bitline 60c. Also, the wordline and bank selector decoder instructs selector 16 to couple the column 54c, representing the sources of the second column of transistors, to bitline 60b.

Then bitline decoder 24 and virtual ground decoder 26 each decode an address AY0-AYN to select different ones of the plurality of metal bitlines 60a–f. The bitline decoder 24 selects bitline 60c and couples it to the sensing amplifier 30. The virtual ground decoder 26 selects bitline 60b and couples it to Vss. Depending on the value of the addressed location, the drain line is pulled low or remains high. Then the sensing amplifier 30 senses the voltage on bitline 60c to ascertain the value of the selected location and outputs data on line 32.

Bitline decoder 24 and virtual ground decoder 26 have access to both Vcc and Vss for driving any of the selected columns high in voltage or low in voltage respectively. In this context, Vcc is typically a standard voltage supply such as 1.5 V, 3 V, 5 V or higher, while Vss is typically ground. However, no limit to the applicable voltage supply is intended since the important concept involves applying a voltage bias across the source and drain, and a applying a voltage to the gate above the threshold voltage (Vt). Moreover, as used herein, the term power includes positive, negative and ground.

The configuration shown in FIG. 1 performs as a virtual ground array where a bias can be presented across any selector location by properly activating the selector control lines 57a–d. An advantage of the virtual ground configuration is that the sources and drains of the transistor array can be configured consistently to the right or left as desired, and individual buried N+ columns can be activated through the selectors 14, 16 to establish a bias across two adjacent buried N+ columns.

Referring to FIG. 2, an enlarged view of the columns 54a–e and rows 56a–d of a flat-cell bank 10 is shown. The columns 54a–e are made of buried N+, but may also be buried N–. The rows 56a–d are made of polysilicon that is deposited over the flat-cell array. The ROM code implant 59 is a boron enhancement type implant and can be implanted either before or after the polysilicon layer has been deposited. As an example: a first type of transistor is blanket-doped with a light boron doping and has a voltage threshold of approximately 0.7 V (Vt1), and a second type of transistor is target-doped with a heavy boron doping and has a voltage threshold of approximately 6 V (Vt2); the blanket boron concentration is approximately $18E12$ atoms/cm$^3$ and the heavy boron concentration is approximately $1.2E13$ atoms/cm$^3$; and the implantation energy is approximately 25 KeV for implantation made before forming the polysilicon row 156, and approximately 180 KeV if made after.

FIG. 3 depicts a void transistor 11 of the flat-cell array 10 as a cross-sectional view. The substrate 52 is implanted with N+ columns 54a–b, a ROM code implant 59 in the channel between adjacent columns 54a, 54b, and below a polysilicon row 56a. Moreover, an insulator 52, such as silicon dioxide, is formed between the surface of the substrate 51 and the polysilicon row 56a to prevent a short circuit. A valid transistor is similar to the void transistor, but with no additional doping implanted into the channel. As a transistor model, the adjacent columns 54a, 54b form the source and drain, or reverse, while the polysilicon 56 over the channel forms the gate.

Figure 4:
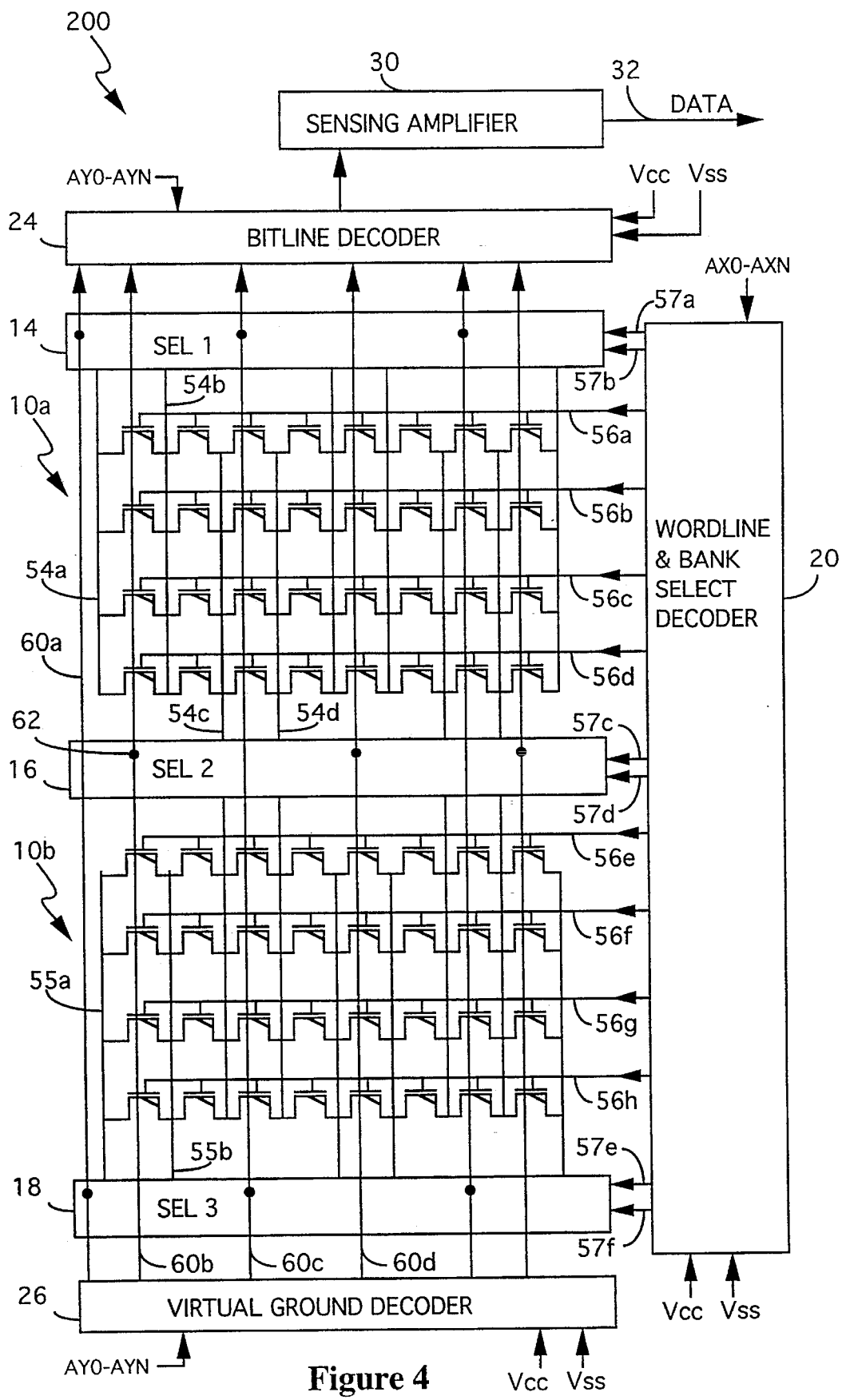
FIG. 4 depicts a ROM having multi-bank flat-cell arrays incorporating the present invention.

FIG. 4 depicts a multi-bank flat-cell ROM 200. Multi-bank flat-cell arrays are beneficial for fast speed operations. Each bank 10a and 10b is connected to an upper selector and lower selector; bank 10a has an upper selector 14 and a lower selector 16, and bank 10b has an upper selector 16 and a lower selector 18. The selectors 14 and 18 are identical, and the selector 16 is a mirrored version of selector 16 shifted by 2 buried N+ columns. The shift of adjacent selectors permits contacts 62 to the bitlines 60 only at every other bitline pitch. This is advantageous for design and manufacture because it gives the designer space to place and form the contact pad, and as a result relaxes the design rules.

Figure 5:
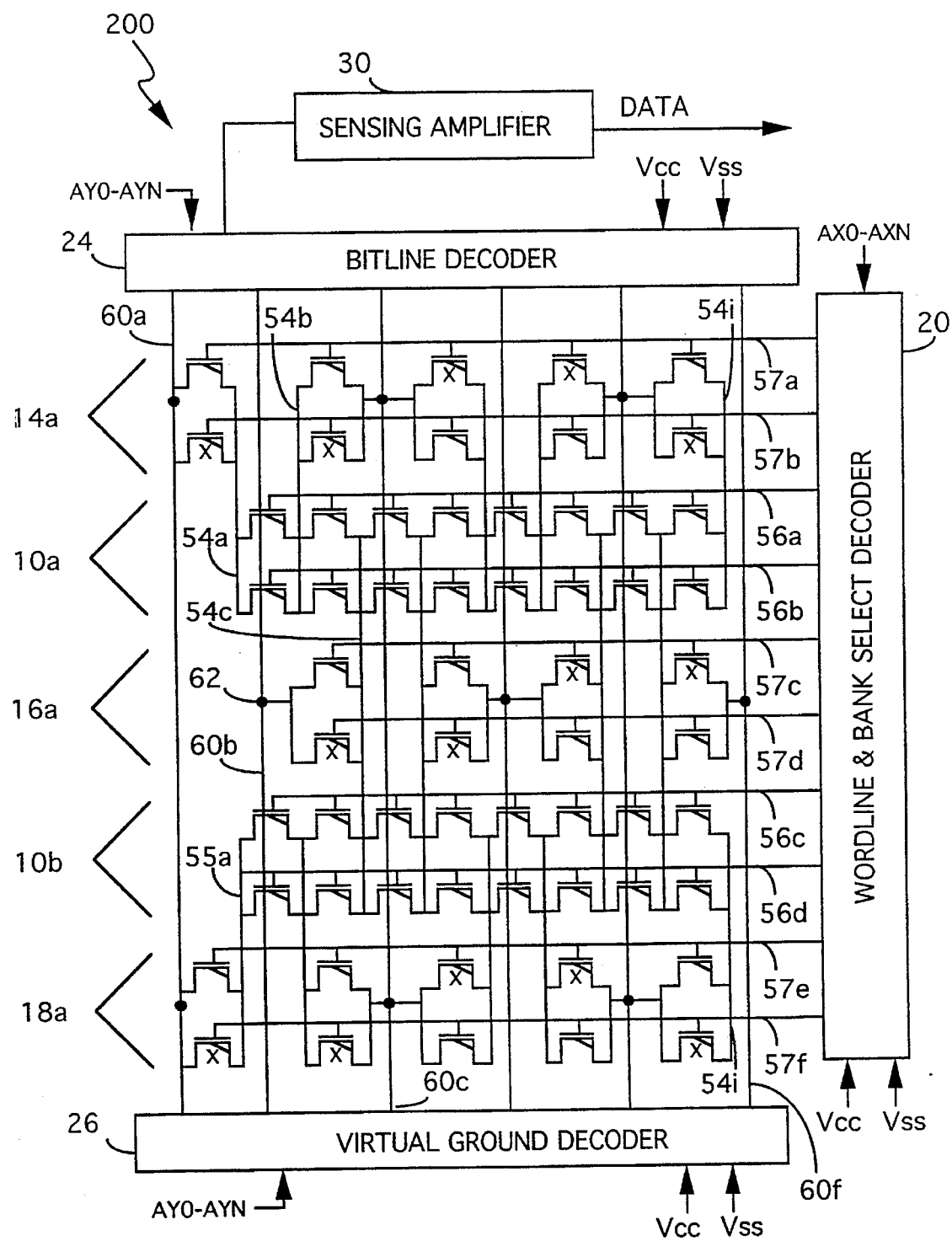
FIG. 5 depicts a ROM having multi-bank flat-cell arrays incorporating the present invention and showing a one-pair bank select.

FIG. 5 depicts a multi-bank ROM array 200 showing a one-pair bank select 14a, 16a and 18a. The purpose of the selectors is to couple the decoders, via bitline traces 60a–f, to the buried N+ columns 54a–i and 55a–i. As shown, the selectors 14a, 16a and 18a are exposed as circuits; where selector 14a and 18a are identical and 16a is a shifted version of 14a. In selectors 14a, 16a, 18a, the transistors having the "x" therein are considered to be void transistors while the others are valid transistors. Bank 10a has an upper selector 14a and a lower selector 16a. Since, for example, an upper selector 14a and lower selector 16a each contain a pair of transistors for each coupled column 54a–i, and are connected to all the buried N+ columns 54a–i of an array 10a, a non-ambiguous electrical path can always be made between a desired buried N+ column 54a–i and a bitline trace 60a–f via a contact such as 62.

This feature of creating a non-ambiguous electrical path is demonstrated in selector 16a by the pattern of valid and void transistors. This pattern provides a controllable circuit for the wordline decoder 20 to manage. The wordline decoder 20, by setting one of the lines 57c–d, provides a unique coupling between any column 54a–i and a corresponding bitline 60a–f. If, for example, the selector row 57c is activated and no other selector row 57a–f is activated, a non-ambiguous coupling is achieved between a buried N+ column 54c and bitline 60b through contact 62.

To effect a NOR array in the first Column of the array 10a, the wordline and bank select decoder 20 selects 57a and 56a. The virtual groundline decoder selects bitline 60c and the bitline decoder selects bitline 60a. Thus, the source of the first column 54b is pulled down to Vss and the drain of the first column 54a is pulled high. If the memory location between the columns 54a and 54b and under the polysilicon row 56a is a valid transistor then the column 54a is pulled low and the sensing amplifier 30 outputs a "0." However, if the memory location is void then the column 54a remains high and the sensing amplifier 30 outputs a "1."

As shown, this configuration of the flat-cell array 10a illustrates that a first class of altering pairs of buried N+ columns 54a–b, 54e–f, 54i are connected to the upper selector 14a, and a second class of alternating pairs of buried N+ columns 54c–d, 54g–h are connected to the lower selector 16a. This configuration, along with the specific pattern of void and valid transistors in the selectors 14a, 16a, 18a, allows the selective coupling of a column 54a–i to one of the bitlines 60a–f depending on the address AX0-AXN input to decoder 20 which in turn selects rows 57 and 58.

Figure 6:
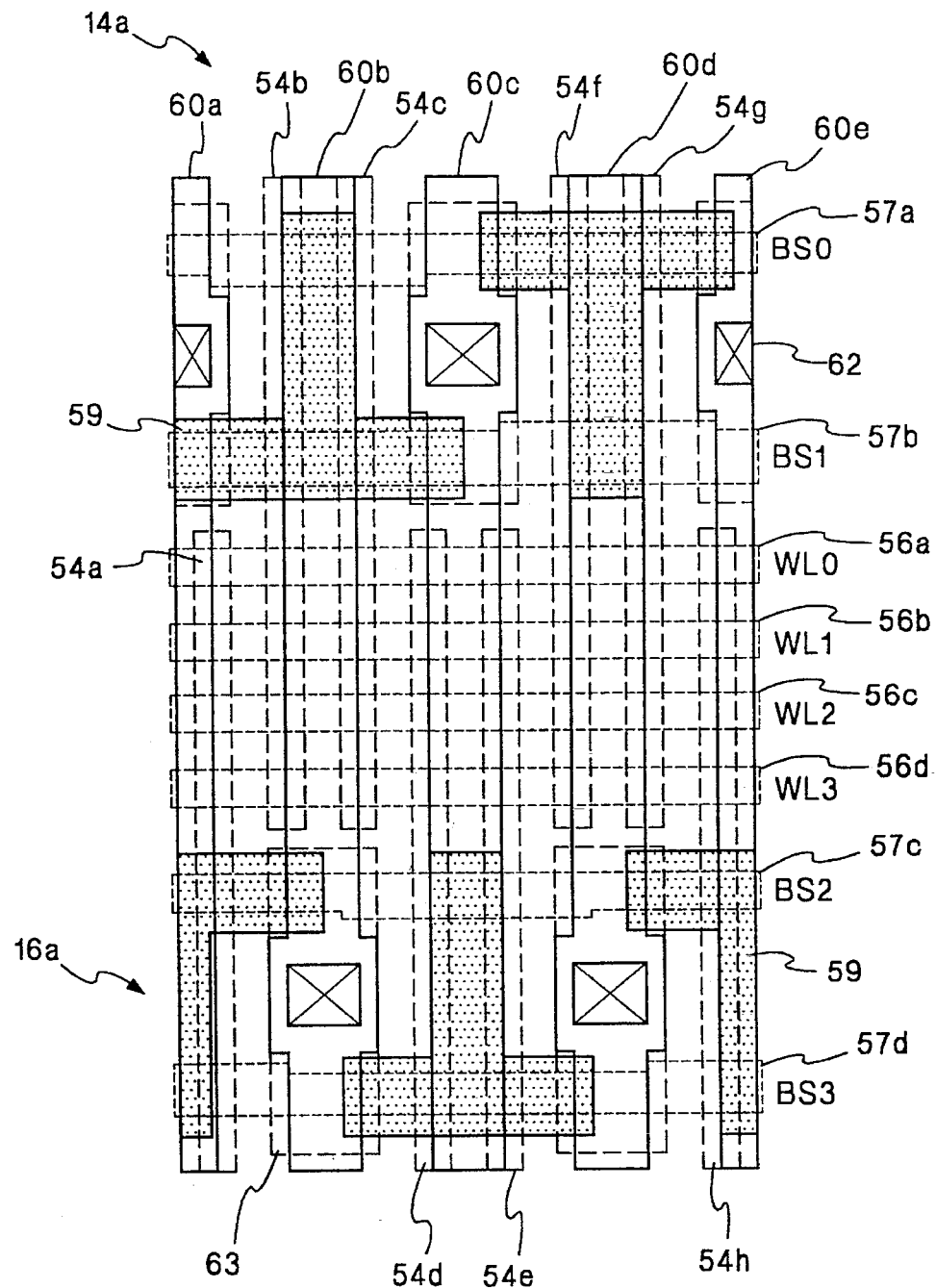
FIG. 6 depicts a one-pair bank selector layout incorporating the present invention.

FIG. 6 depicts a selector layout incorporating the present invention. To concentrate on bank 10a and selectors 14a and 16a, an expanded view is shown for the layout of the buried N+ columns 54a–h, the polysilicon rows 56a–d and 57a–d, and the ROM code implant 59. The regions between the columns 54a–i where there is a ROM code implant 59 represent void transistors and the regions between the columns 54a–i where there is no ROM code implant represent valid transistors. A desire of the layout is to minimize the amount of resistance in the selector transistors, and for this reason, the polysilicon can be laid out wider in the selectors than in the array.

FIG. 6 also shows the active contact 62 formed as a via to a buried N+ pad 63. This construction depends on the layout design guidelines for the integrated circuit fabrication. If layout design guidelines permit direct contact to the buried N+ pad 63, the single-bank selector shown in FIG. 6 is best since it uses the least real estate. Other layout design guidelines, where an active contact pad must be formed and additional active space is needed to form a contact, are explained in reference to FIGS. 7–9.

Figure 7:
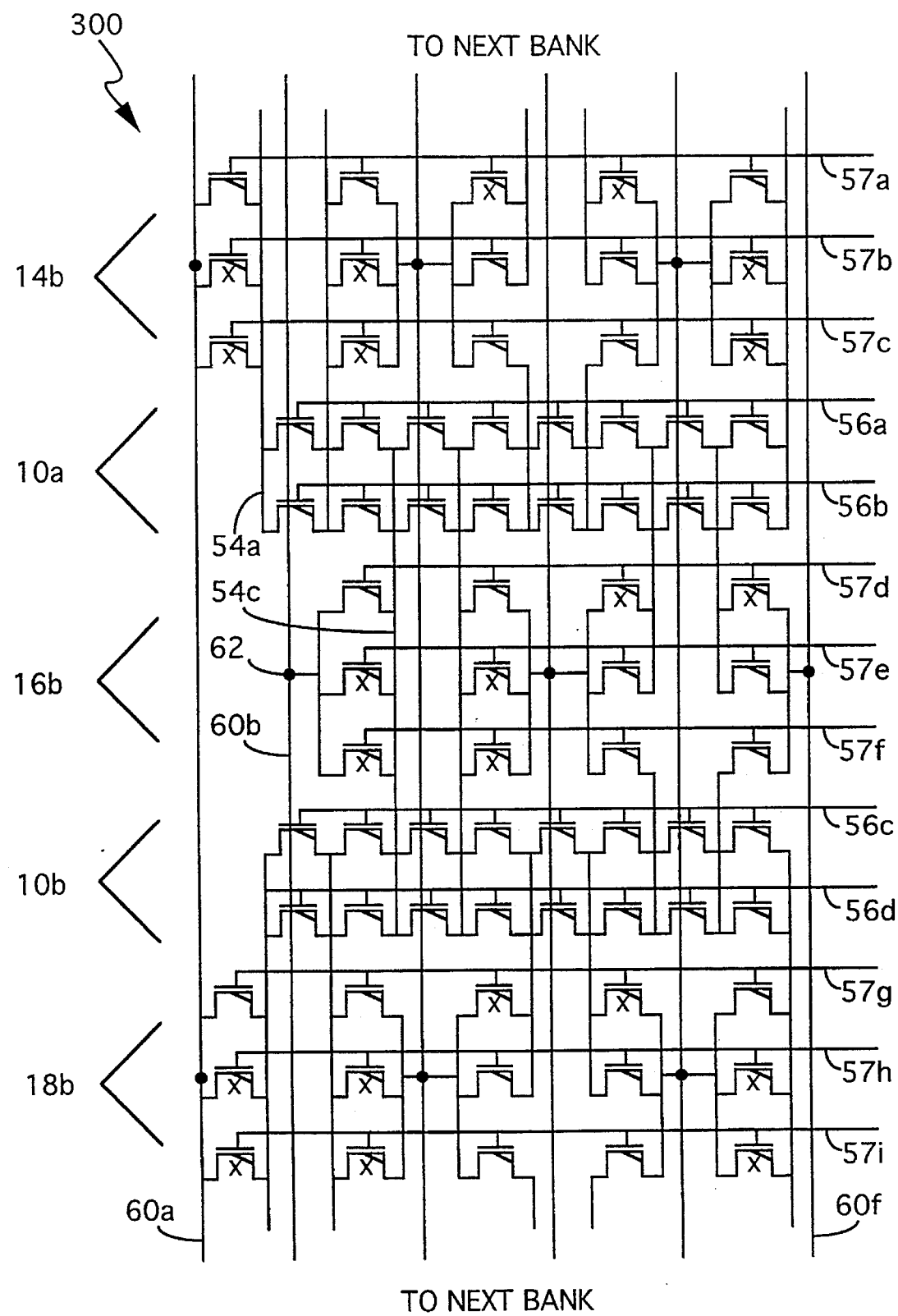
FIG. 7 depicts a ROM having multi-bank flat-cell arrays incorporating the present invention and showing a one-pair-and-half bank select.

FIG. 7 depicts a ROM 300 having a multi-bank flat-cell array 10a, 10b with a one-pair-and-half bank select 14b, 16b and 18b. This one-pair-and-half bank is an adaptation of the one-pair bank for technologies where the design rules require extra room to form a connection between a metal bitline 60 and a buried N+ pad 63.

Figure 9:
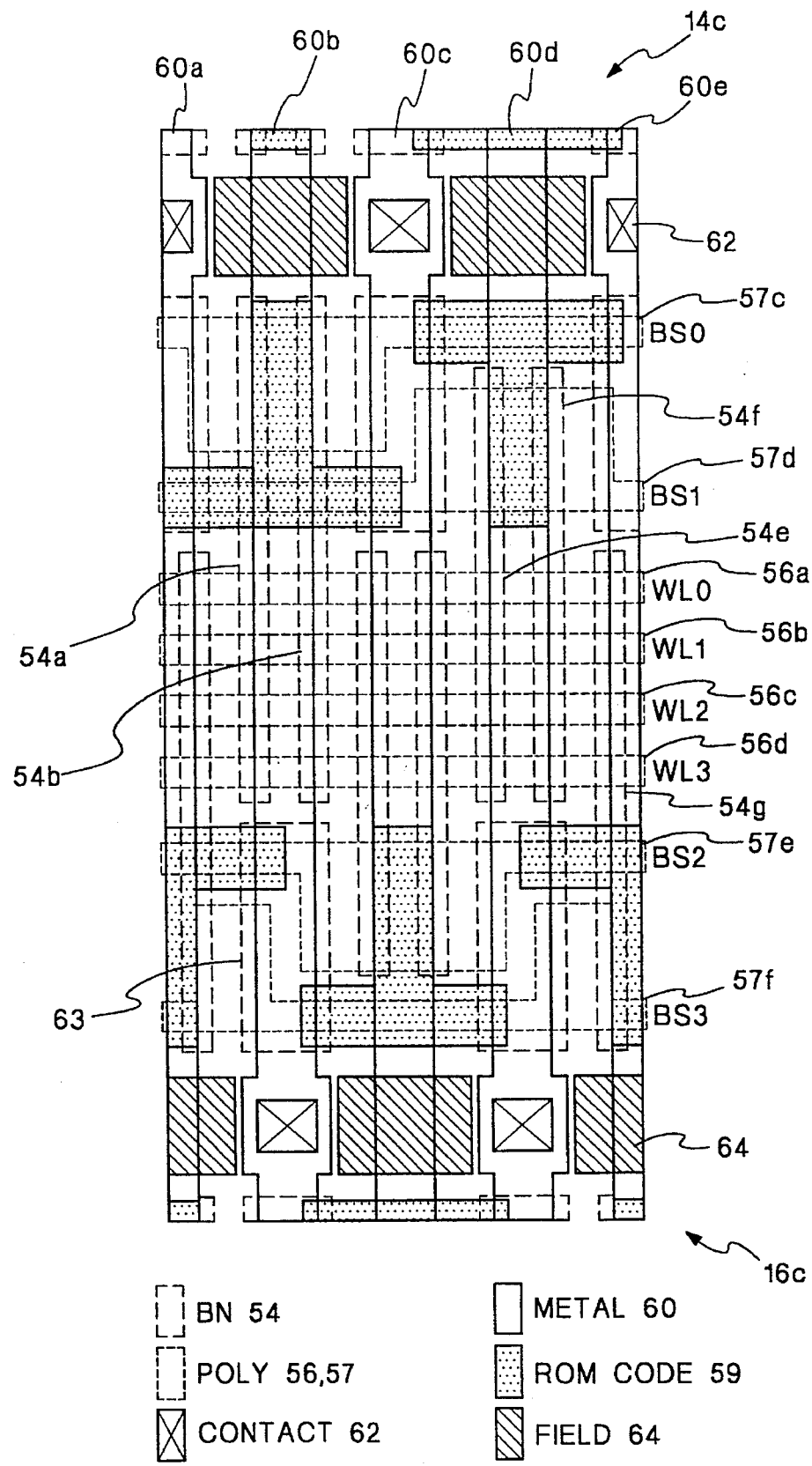
FIG. 9 depicts a two-pair bank selector layout incorporating the present invention.

A bank 10a has an upper selector 14b and a lower selector 16b. Selector 14b has three rows 57a–c for coupling the buried N+ columns 54a–b, 54e–f, 54i and the bitlines 60a, 60c, 60e via contacts 162. Selector 16b has three rows 57d–f for coupling the buried N+ columns 54c–d, 54g–h and the bitlines 60b, 60d, 60f via contacts 162. As shown, in each selector transistor column, at least one of the transistors is void and at least one is valid. This permits, for at least two polysilicon rows, the same type of interlocking space saving as shown in FIG. 9 and discussed below.

Figure 8:
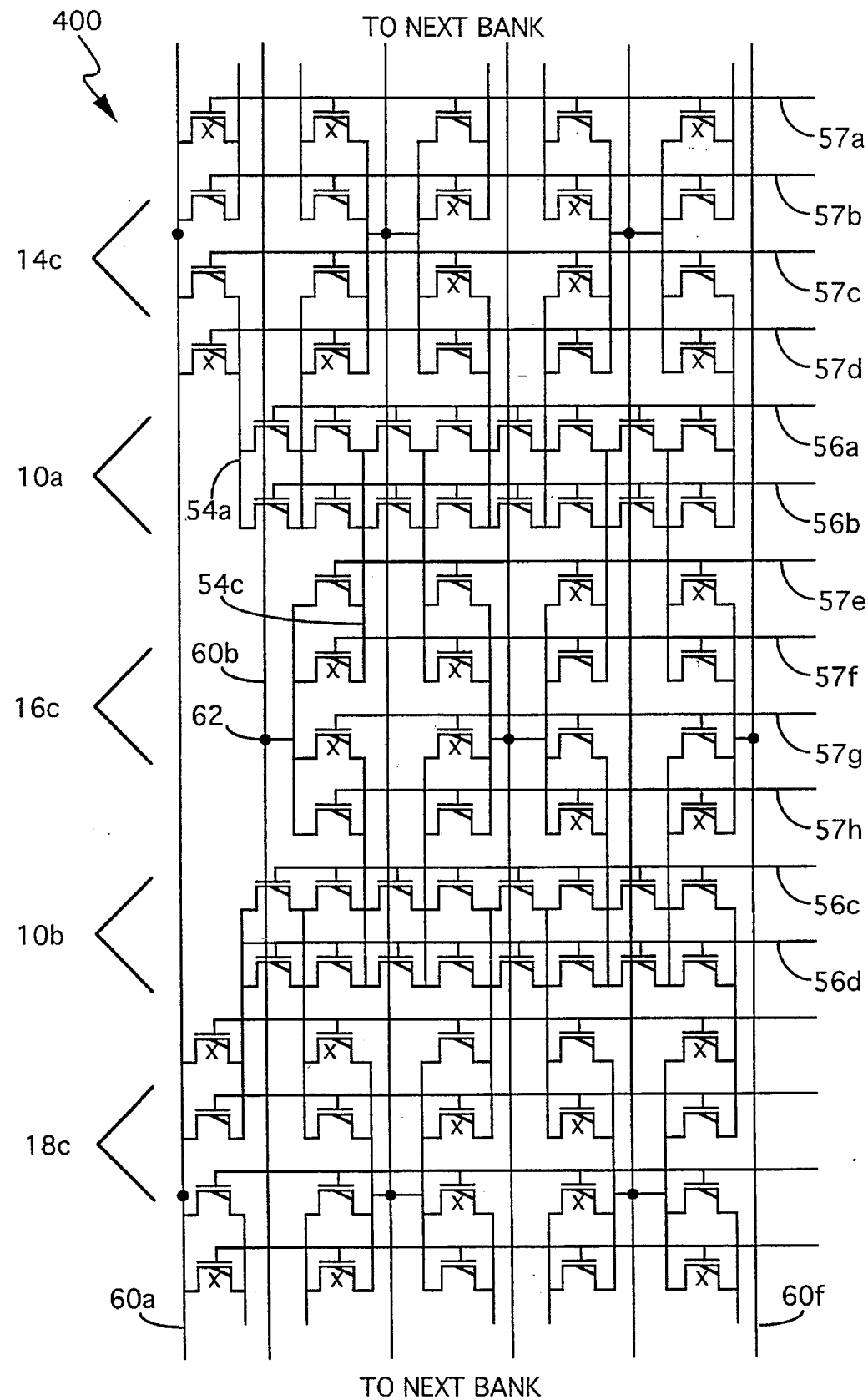
FIG. 8 depicts a ROM having multi-bank flat-cell arrays incorporating the present invention and showing a two-pair bank select.

FIG. 8 depicts a ROM 400 having a multi-bank flat-cell array 10a, 10b with a two-pair bank select 14c, 16c and 18c. This two-pair bank is an adaptation of the one-pair bank for technologies where the design rules require extra room to form a connection from a metal bitline 60a–f to a buried N+ pad 63.

A bank 10a has an upper selector 14c and a lower selector 16c. Selector 14c has four rows 57a–d for coupling the buried N+ columns 54a–b, 54e–f, 54i and the bitlines 60a, 60c, 60e via contacts 162. Selector 16c has four rows 57e–h for coupling the buried N+ columns 54c–d, 54g–h and the bitlines 60b, 60d, 60f via contacts 162. As shown, in each selector transistor column, two of the transistors are void and at least two are valid.

Since the placement of the valid and void transistors is known in advance, the geometry of the ROM code implant 59 and polysilicon selector rows 57a–d can be planned in advance. The strategy is to maximize the gate width for valid transistors in order to reduce resistance. Since the valid transistors are formed adjacent to void transistors, the desired arrangement is depicted in FIG. 9, where wide polysilicon is laid over valid transistors and an accommodating narrow polysilicon is laid over void transistors. The result is an efficient interlocked pattern achieving characteristics of low resistance by providing large channels and gates for the valid transistors, and compact design by using a minimum of real estate for the void transistors. This pattern is equally represented in selectors 16c and 18c.

Figure 10:
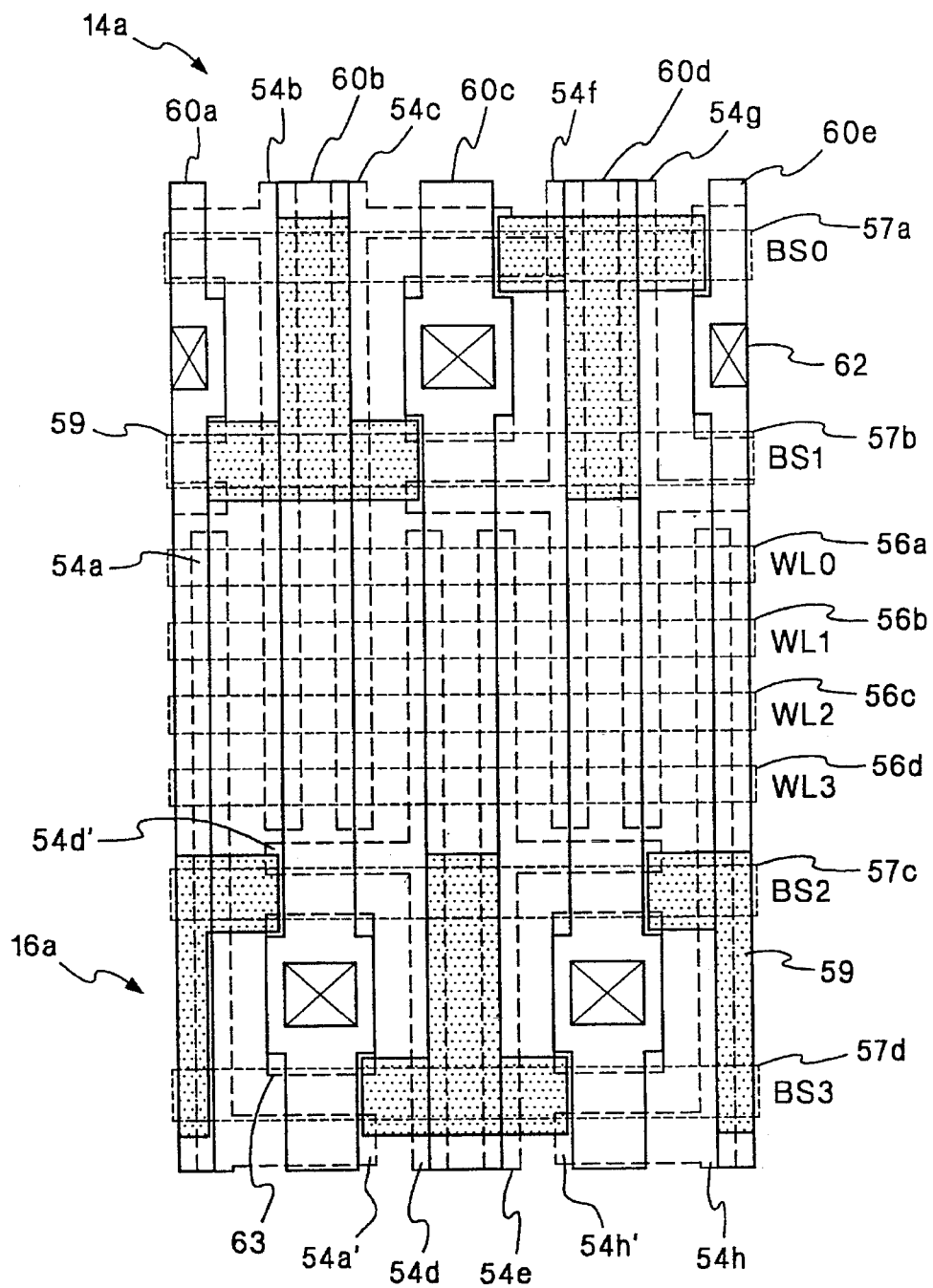
FIG. 10 depicts a bank selector layout incorporating another aspect of the present invention.

FIG. 10 depicts a bank selector layout incorporating another aspect of the present invention. The buried N+ columns 54a–h each include a limb 54a'–h' extending laterally from the column near a corresponding buried N+ pad 63, which has a side that is parallel to a limb that forms a valid transistor. In FIG. 10, the limb 54a' is shown extending laterally from column 54a, limb 54d' is shown extending laterally from column 54d, and limb 54h' is shown extending laterally from column 54h.

The selector transistors are formed by the limb, the pad, a channel therebetween and a polysilicon row. The limb forms the source and the pad forms the drain, or reverse, and a polysilicon row forms the gate. In FIG. 10, the pad identified by reference numeral 63 has a side that is parallel to limb 54a'. The region between the limb and the corresponding parallel pad side is blanket-doped to form a valid transistor. The positioning of the buried N+ limb and pad increases the size of the valid transistor channel and gate, thus, reducing resistance and improving the effectiveness of the selector network.

This configuration shown in FIG. 10 results in an efficient layout scheme where pairs of locations are laid out, one of the pair being a valid transistor and the other a void transistor. This permits the limb design to alternate among columns of buried N+. For example, the limb 54a' in conjunction with pad 63 and row 57d forms a valid transistor (because it has a blanket-doped channel), while the column 54a in conjunction with pad 63 and row 57c forms a void transistor (because it has a target-doped channel). And, the limb 54d' in conjunction with pad 63 and row 57c forms a valid transistor (because it has a blanket-doped channel), while the column 54d in conjunction with pad 63 and row 57d forms a void transistor (because it has a target-doped channel). These pairs of locations—one valid and the other void—permit the efficient alternating limb layout depicted in FIG. 10.

Figure 11:
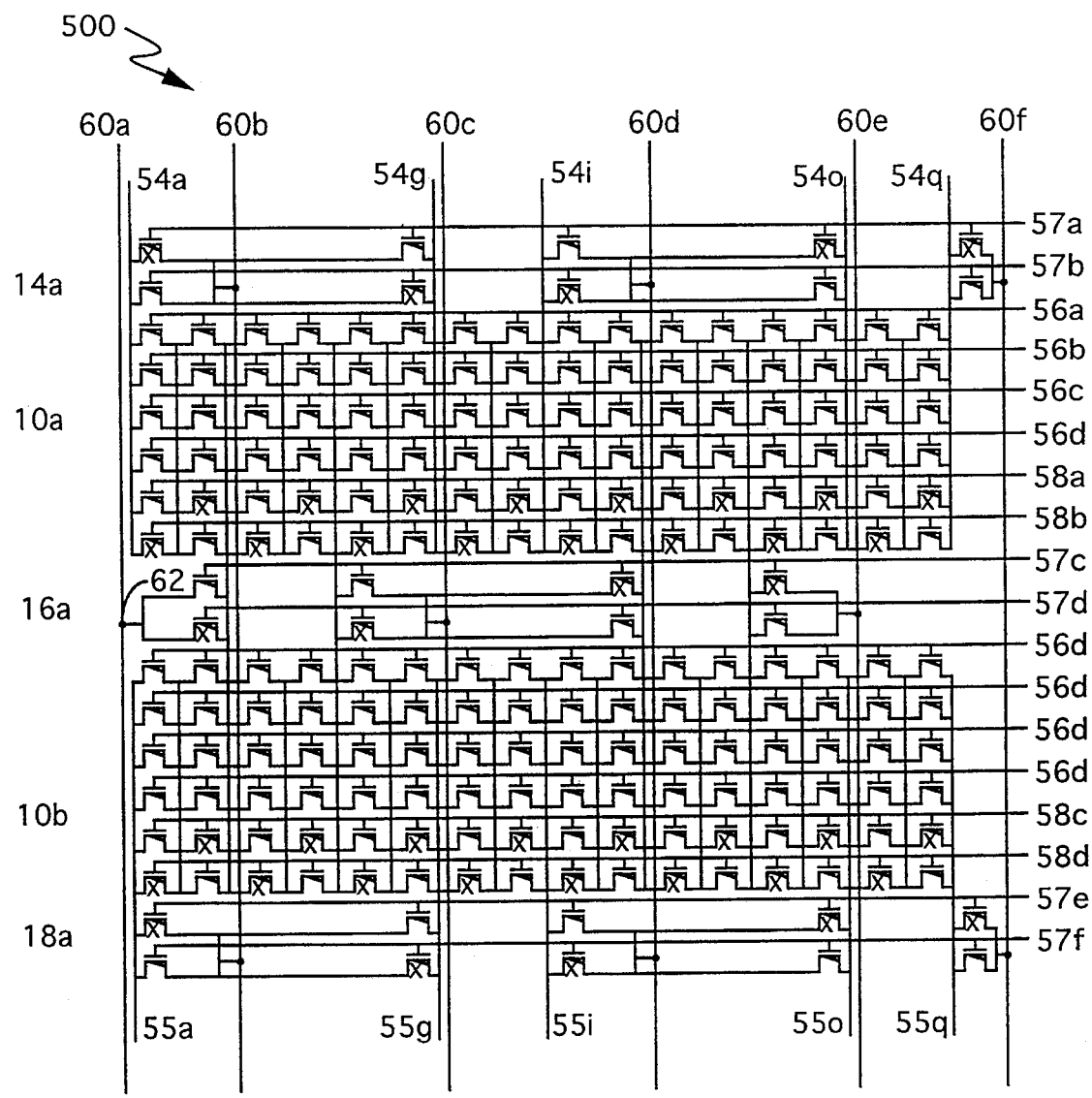
FIG. 11 depicts a ROM having multi-bank flat-cell arrays incorporating the present invention and showing a one-pair bank select.

FIG. 11 depicts a multi-bank flat-cell ROM 500 showing a one-pair bank select. An additional two rows 58a–b are added to the bank 10a and an additional two rows 58c–d are added to the bank 10b to permit the selection between one of a pair of adjacent transistor columns. In this configuration, lines 58a and 58b are typically referred to right-select and left-select respectively.

As shown, while columns 54a, 54g, 54i, 54o and 54q are labelled, it must be understood that the columns are referenced in alphabetical order. This configuration of the flat-cell array 10a illustrates that a class of alternating sets of buried N+ columns 54a, 54g, 54i, 54o, and 54q are connected to the upper selector 14a, and a different class of alternating sets of buried N+ columns 54c, 54e, 54k and 54m are connected to the lower selector 16a. This configuration, along with the specific pattern of void and valid transistors in the selectors 14a, 16a, 18a, allows the selective coupling of a column 54a–q to one of the bitlines 60a–f depending on the address AX0-AXN input to decoder 20 which in turn selects rows 57 and 58.

For example, to effect a NOR array in the first column of the array 10a, the wordline and bank select decoder 20 selects rows 57b, 56a and 58b while deselecting all others. The virtual ground decoder 26 selects bitline 60a and the bitline 24 decoder selects bitline 60b. Thus, the source of the first column 54b is pulled down to Vss and the drain of the first column 54a is pulled high to Vbias. If the memory location between the columns 54a and 54b and under the polysilicon row 56a is a valid transistor then the column 54a is pulled low and the sensing amplifier 30 outputs a "0." However, if the memory location is void then the column 54a remains high and the sensing amplifier 30 outputs a "1."

By incorporating a left or right selector into the bank, the pitch of the metal bitlines 60a–f and the pitch of the contacts 62 is effectively doubled. The buried N+ connection to the selector networks 14a and 16a is every other buried N+ column, where these columns form a class of alternating sets of connections to the selector network 14a and a class of alternating sets of connections to the selector network 16a. As a result, the bitline decoder 24 and virtual ground decoder 26 are connected via metal bitlines 60a–f that have a layout pitch of every four buried N+ columns and contact pitch of every eight buried N+ columns.

Figure 12:
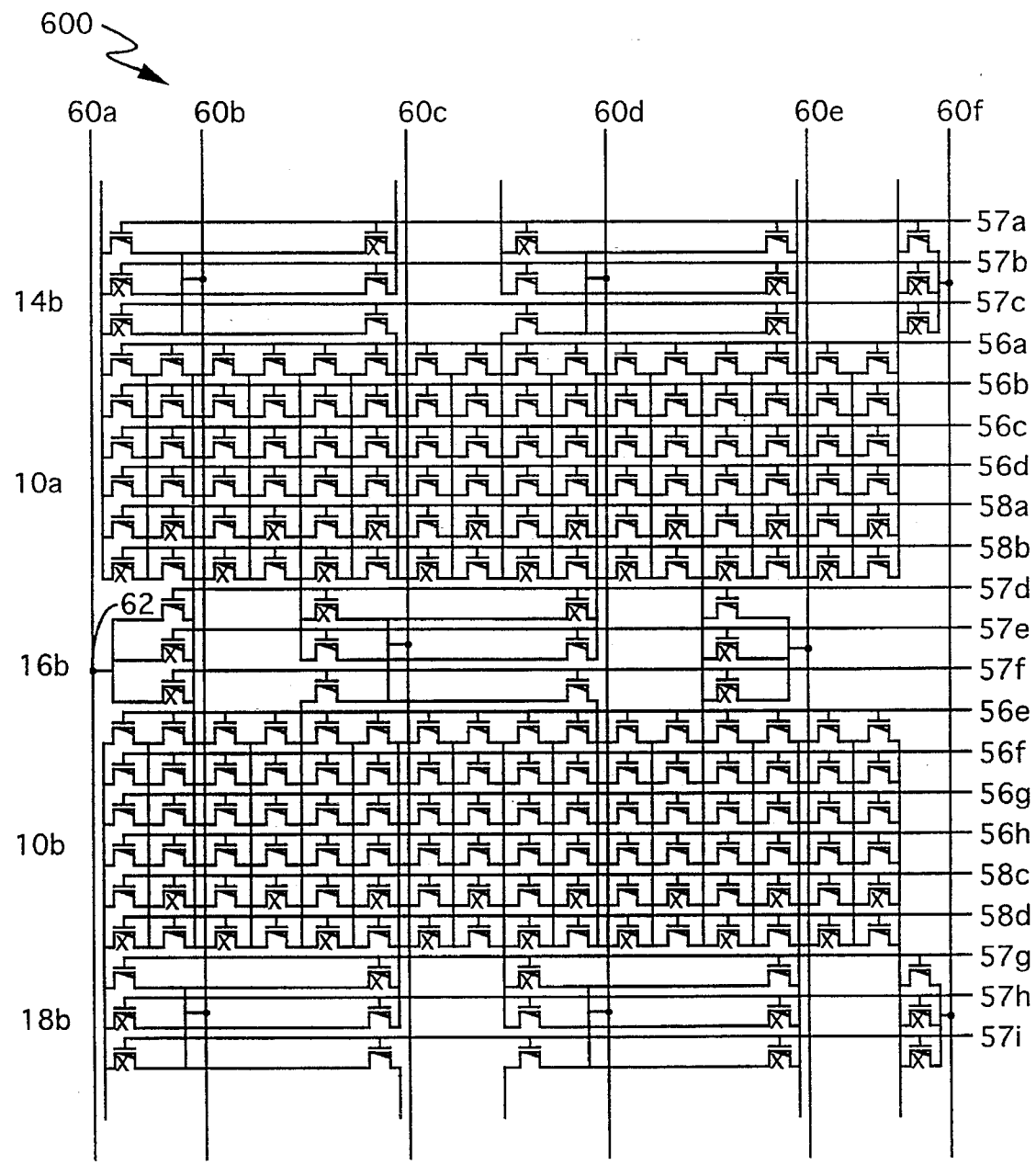
FIG. 12 depicts a ROM having multi-bank flat-cell arrays incorporating the present invention and showing a one-pair-and-half bank select.

FIG. 12 depicts a multi-bank flat-cell ROM 600 showing a one-pair-and-half bank select. An additional two rows 58a–b are added to the bank 10a and an additional two rows 58c–d are added to the bank 10b to permit the selection between one of a pair of adjacent transistor columns. This configuration also has the benefits discussed with respect to FIG. 11.

Figure 13:
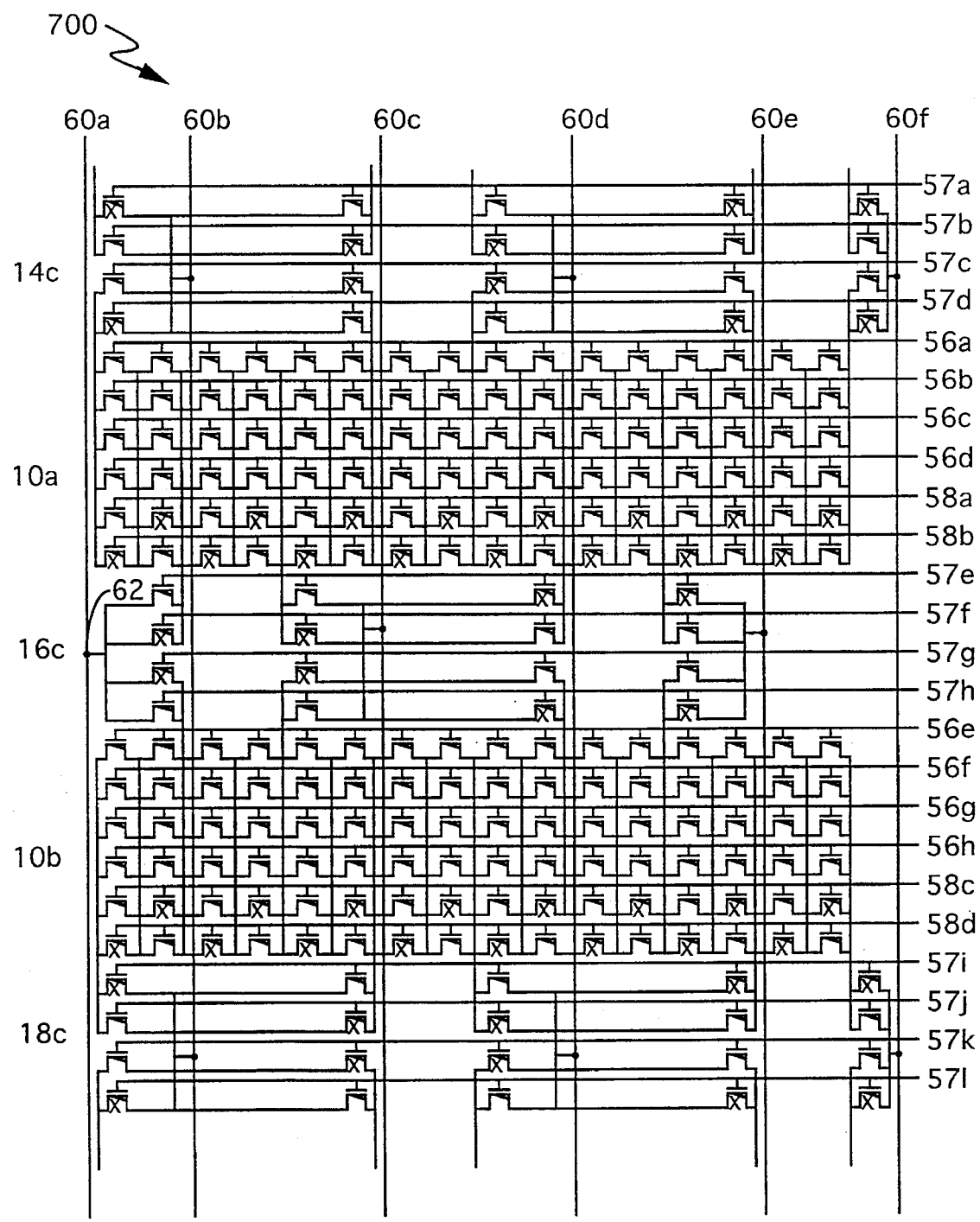
FIG. 13 depicts a ROM having multi-bank flat-cell arrays incorporating the present invention and showing a two-pair bank select.

FIG. 13 depicts a multi-bank flat-cell ROM 700 showing a two-pair bank select. An additional two rows 58a–b are added to the bank 10*a* and an additional two rows 58*c–d* are added to the bank 10*b* to permit the selection between one of a pair of adjacent transistor columns. This configuration also has the benefits discussed with respect to FIG. 11.

The present invention can be implemented with any bank size, including 16, 32, 64 or more rows. Additional storage transistors are fabricated between the columns in parallel with the transistors as shown in the Figures. Additional wordline rows 56 are designed into the wordline and bank select decoder 20 to access the extra rows.

The present invention can also be implemented with 16, 32 or more columns. Additional buried N+ columns 54 are formed and additional storage transistors are fabricated therebetween. Additional metal bitlines 60 are designed into the bitline decoder 24 and virtual groundline decoder 26.

The present invention can also be implemented with ROM storage locations that each represent one of a plurality of values. The transistor channels are doped with substances such as boron and phosphorous that result in each transistor having one of a plurality of threshold voltages ($V_{t1}$, $V_{t2}$, . . . $V_{tn}$). The decoder accessing the addressed location and, along with the sensing amplifier 30, determines the value stored in the selected location. For example, reference is made to co-pending U.S. patent application Ser. No. 08/203,984, Multistate ROM Memory Cell Array, which describes a technique for selectively implanting different ion concentrations into the channels of a ROM memory cell to develop cells having at least four states. By combining at least three different implant concentrations of elements such as boron and phosphorous, four types of transistors are developed representing four different values. These values can be represented as "00," "01," "10," and "11."

SOME VARIATIONS TO THE DISCLOSED EMBODIMENTS

Having disclosed a preferred embodiment and the best mode, there are a number of modifications that will be obvious to one skilled in the art. This specification is intended to cover all embodiments within the spirit of the invention that is claimed.

For example, a variation involves using depletion mode transistors in place of the enhancement mode transistors. This variation is easily handled by the present invention because each of the wordline decoder, bitline decoder and virtual ground decoder have access to all power levels, and the unique selector design provides access of any power level to any column.

Another variation involves combining enhancement mode and depletion mode transistors in the ROM array. As described above, this is handled by the decoders and selectors by providing appropriate power levels to the columns and rows.

What is claimed is:

1. A flat-cell ROM comprising:

(a) a flat-cell array of transistors formed on a substrate, each transistor having a source, drain and gate, said array formed by ion implantation in a channel between columns of buried conductive structure and under rows of polysilicon, wherein adjacent columns of buried conductive structure are the source and drain of at least one of said transistors and a corresponding row of polysilicon is the gate of said transistor;

(b) a first selector network associated with said flat-cell array, connected to a first class of alternating sets of said columns of buried conductive structure and configured to be controlled by a first selector signal; and (c) a second selector network associated with said flat-cell array, connected to a second class of alternating sets of said columns of buried conductive structure and configured to be controlled by a second selector signal.

2. The ROM of claim 1, wherein:

said first selector network associated with said flat-cell array is connected to a first class of alternating pairs of said columns; and said second selector network associated with said flat-cell array is connected to a second class of alternating pairs of said columns.

3. The ROM of claim 1, wherein:

said first selector network includes at least one transistor to connect a first of said columns to a sense amplifier; and said second selector network includes at least one transistor to connect a second of said columns to a power supply.

4. The ROM of claim 3, wherein:

adjacent columns of said columns are a bit select and a corresponding one of said rows of polysilicon is a word select.

5. The ROM of claim 1, further comprising:

(d) a plurality of metal bitlines with a pitch double that of said columns, with a first class of alternating ones of said plurality of metal bitlines connected to said first selector network with a pitch quadruple that of said columns and a second class of alternating ones of said plurality of metal bitlines connected to said second selector network with a pitch quadruple that of said columns.

6. The ROM of claim 5, wherein:

said selector transistors are large compared to transistors in said flat-cell array of transistors.

7. The ROM of claim 1, further comprising:

(d) a decoder network coupled to said columns and said rows and configured to decode an input address to select a corresponding transistor.

8. A flat-cell ROM comprising:

(a) a bank of field effect transistors, each having a source, drain and gate, formed by ion implantation between columns of buried conductive structure and under rows of polysilicon, wherein adjacent columns of buried conductive structure are the source and drain of at least one of said transistors and a corresponding row of polysilicon is the gate of said at least one of said transistors, wherein said bank is grouped into pair columns and said bank includes two rows of transistors for selecting one of said pair;

(b) a selector network associated with said bank including a first selector network connected to a first class of alternating sets of said columns of buried conductive structure and configured to be controlled by a first selector signal, and a second selector network connected to a second class of alternating sets of said columns of buried conductive structure and configured to be controlled by a second selector signal;

(c) a plurality of metal bitlines with a pitch quadruple that of said columns, with a first class of alternating ones of said plurality of metal bitlines connected to said first selector network with a pitch octuple that of said columns and a second class of alternating ones of said plurality of metal bitlines connected to said second selector network with a pitch octuple that of said columns; and (d) a decoder network, coupled to said columns and said rows, for decoding an input address to select a corresponding field effect transistor.

9. The ROM of claim 1, further comprising:

(d) a plurality of metal bitlines with a pitch quadruple that of said columns, with a first class of alternating ones of said plurality of metal bitlines connected to said first selector network with a pitch octuple that of said columns and a second class of alternating ones of said plurality of metal bitlines connected to said second selector network with a pitch octuple that of said columns.

10. The ROM of claim 1, wherein:

said flat-cell array of transistors are grouped into pair columns and said flat-cell array includes two rows of transistors for selecting one of said pair columns.

11. The ROM of claim 1, wherein said first and second selector networks each include:

a buried conductive structure selector column coupled to said flat-cell array and a buried conductive structure pad coupled to an active contact, said selector column and said pad having a distinct pair of locations therebetween;

in said pair of locations, a blanket-doped first location and a target-doped second location; and a first polysilicon selector row deposited over said first location to form a gate thereover, and a second polysilicon selector row deposited over said second location.

12. The ROM of claim 11, wherein:

said first polysilicon selector row over said first location has an extension extending over said first location and said second polysilicon selector row over said second location has an accommodation complementary to said extension.

13. The ROM of claim 11, wherein:

said first location is large in comparison to said second location; and said first polysilicon selector row over said first location has an extension extending over said first location and said second polysilicon selector row over said second location has an accommodation complementary to said extension.

14. The ROM of claim 11, further comprising:

a second buried conductive structure selector column coupled to said flat-cell array and a second buried conductive structure pad coupled to a second active contact, said second selector column and said second pad having a distinct second pair of locations therebetween;

in said second pair of locations, a blanket-doped third location and a target-doped fourth location; and said second polysilicon selector row deposited over said third location to form a gate thereover, and said first polysilicon selector row deposited over said fourth location.

15. The ROM of claim 14, wherein:

said first polysilicon selector row over said first location has a first extension extending over said first location and said second polysilicon selector row over said second location has an accommodation complementary to said first extension; and said second polysilicon selector row over said third location has a second extension extending over said third location and said first polysilicon selector row over said fourth location has an accommodation complementary to said second extension.

* * * * *